(12) United States Patent
Yokoyama

(10) Patent No.: US 7,976,262 B2
(45) Date of Patent: Jul. 12, 2011

(54) FOUP OPENER

(75) Inventor: Shinji Yokoyama, Tokyo (JP)

(73) Assignee: Hirata Corporation, Shinagawa-Ku, Tokyo (JP)

( * ) Notice: Subject to any disclaimer, the term of this patent is extended or adjusted under 35 U.S.C. 154(b) by 979 days.

(21) Appl. No.: 11/359,531

(22) Filed: Feb. 23, 2006

(65) Prior Publication Data

US 2006/0245849 A1 Nov. 2, 2006

(30) Foreign Application Priority Data

Feb. 25, 2005 (JP) ................................. 2005-051323

(51) Int. Cl.
*B65B 21/02* (2006.01)

(52) U.S. Cl. ........................................ 414/411; 414/217

(58) Field of Classification Search .................. 414/411, 414/217
See application file for complete search history.

(56) References Cited

U.S. PATENT DOCUMENTS

| 5,806,574 | A  | * | 9/1998  | Yamashita et al. ............... 141/63 |
| 6,082,951 | A  | * | 7/2000  | Nering et al. ............... 414/217.1 |
| 6,138,721 | A  |   | 10/2000 | Bonora et al. |
| 6,168,364 | B1 | * | 1/2001  | Miyajima ...................... 414/217 |
| 6,261,044 | B1 | * | 7/2001  | Fosnight et al. ............... 414/217 |
| 6,281,516 | B1 | * | 8/2001  | Bacchi et al. ............. 250/559.29 |
| 6,302,927 | B1 | * | 10/2001 | Tanigawa ..................... 29/25.01 |
| 6,396,072 | B1 | * | 5/2002  | Meyhofer et al. .......... 250/559.4 |
| 6,419,438 | B1 | * | 7/2002  | Rosenquist .................... 414/217 |
| 6,470,927 | B2 | * | 10/2002 | Otaguro .......................... 141/98 |
| 6,502,869 | B1 | * | 1/2003  | Rosenquist et al. ............. 292/59 |
| 6,533,521 | B1 | * | 3/2003  | Todorov et al. ............. 414/217.1 |
| 6,704,998 | B1 | * | 3/2004  | Bonora et al. ................... 29/700 |
| 6,824,344 | B2 | * | 11/2004 | Otaguro ..................... 414/217.1 |
| 6,984,097 | B1 | * | 1/2006  | Saeki et al. ..................... 414/411 |
| 6,984,839 | B2 | * | 1/2006  | Igarashi et al. ........... 250/559.33 |
| 7,021,882 | B2 | * | 4/2006  | Otaguro ..................... 414/217.1 |
| 7,112,027 | B2 | * | 9/2006  | Nagata .......................... 414/411 |
| 7,360,346 | B2 | * | 4/2008  | Miyajima et al. ............... 53/432 |
| 7,377,736 | B1 | * | 5/2008  | Fujii et al. ..................... 414/217 |
| 2002/0015636 | A1 | * | 2/2002 | Lee et al. ..................... 414/407 |
| 2002/0044859 | A1 | * | 4/2002 | Lee et al. ..................... 414/411 |
| 2003/0103835 | A1 | * | 6/2003 | Nagata .......................... 414/217 |
| 2005/0069420 | A1 | * | 3/2005 | Miyajima et al. ............... 417/53 |
| 2008/0121560 | A1 | * | 5/2008 | Tieben et al. .................. 206/711 |

FOREIGN PATENT DOCUMENTS

JP 11-220001 A 8/1999

* cited by examiner

*Primary Examiner* — Saúl J Rodriguez
*Assistant Examiner* — Glenn Myers
(74) *Attorney, Agent, or Firm* — Buchanan Ingersoll & Rooney PC

(57) ABSTRACT

This invention relates to a FOUP opener in which a FOUP is placed and the FOUP door of the FOUP can be detached so as to allow access to the interior of the FOUP. The FOUP opener includes a port door having an attaching/detaching mechanism for attaching and detaching the FOUP door and a holding mechanism for holding the FOUP door to be detached, and a port door moving unit for moving said port door holding the FOUP door so as that the FOUP is opened. The port door has a main structure in which said attaching/detaching mechanism is arranged and a surface panel to cover said main structure. The surface panel is detachable from said main structure at a front side of the FOUP opener.

14 Claims, 8 Drawing Sheets

FOUP OPENER

FIELD OF THE INVENTION

The present invention relates to a so-called FOUP (Front Opening Unified Pod) opener.

BACKGROUND OF THE INVENTION

When trouble occurring in a FOUP opener is to be coped with and maintenance such as exchanging the component is to be performed, the operator must access the inside of the port door.

With a conventional FOUP opener, when accessing the interior of the opener, due to the structure, generally, the FOUP opener itself is removed from a mini-environment first, or if the FOUP opener is not to be removed, the operator enters the mini-environment (Japanese Patent Laid-Open No. 11-220001). The mini-environment serves as a relay pace which accommodates a wafer handling robot and the like and from which a wafer in the FOUP is transferred to a semiconductor processing apparatus.

The structure of a conventional port door 100 in a FOUP opener as disclosed in Japanese Patent Laid-Open No. 11-220001 usually comprises a port door front member 101 and rear panel 102 (sheet metal panel) formed by press working, as shown in FIG. 1. The port door front member 101 is attached with latch keys (not shown) and has latch key holes 103 from which the key portions project.

In the conventional port door 100 described above, when the operator is to access the inside of the port door 100, he or she cannot do so from the front surface of the port door 100. More specifically, when the operator tries to remove the port door front member 101, the latch keys interfere with the latch key holes 103 and vacuum pads 24 interfere with vacuum pipe holes serving for holding, so the port door front member 101 cannot be removed from the FOUP opener. To merely enlarge the latch key holes 103 and the vacuum pipe holes is not sufficient to prevent interference. If the latch key holes 103 and the vacuum pipe holes are enlarged, the holes must be closed from the rear side in order to prevent dust from flowing from the inside of the port door to enter the mini-environment. Particularly, with press working, it is difficult to form such a structure, and even if it is possible, it may lead to very high costs.

When the operator is to cope with a trouble of and to maintain a driving mechanism or the like in the conventional port door 100, first, the FOUP opener itself must be temporarily extracted from the mini-environment to extract the rear panel 102, as in patent reference 1. This operation requires hard work. If the FOUP opener itself is extracted from the mini-environment, a large opening is left in the mini-environment, and the clean internal environment is exposed to pollution. Even if the FOUP opener is not to be removed, the operator may enter the mini-environment to also pollute the clean internal environment. Even if the FOUP opener is mounted on the mini-environment again after the process, it takes certain time to restore the interior of the mini-environment to a clean environment. After the FOUP opener is attached to the mini-environment, adjustment is required to set the FOUP opener to the original position.

SUMMARY OF THE INVENTION

The present invention has been made in view of the above problems, and has as its object to provide a FOUP opener having such a port door structure that the operator can access the inside of the port door from the front surface of the port door without removing a FOUP opener main body from a mini-environment.

In order to solve the above problems, according to the aspects of the present invention, there is provided a FOUP opener in which a FOUP is placed and a FOUP door of the FOUP can be detached so as to allow access to an interior of the FOUP, the FOUP opener comprising, a port door having an attaching/detaching mechanism for attaching and detaching the FOUP door and a holding mechanism for holding the FOUP door to be detached, and port door moving means for moving the port door holding the FOUP door so as that the FOUP is opened, wherein the port door has a main structure in which the attaching/detaching mechanism is arranged and a surface panel to cover the main structure, and the surface panel is detachable from the main structure at a front side of the FOUP opener.

According to the aspects of the present invention, the surface panel has a latch key hole through which a latch key that forms part of the attaching/detaching mechanism is inserted and which has such a size as not to interfere with the latch key.

According to the aspects of the present invention, the main structure has an access hole through which the latch key of the attaching/detaching mechanism is accessed from the rear surface of the port door to disengage the latch key.

According to the aspects of the present invention, the latch key portion which forms part of the attaching/detaching mechanism is set to close the access hole.

According to the aspects of the present invention, the port door comprises a rear panel which covers the main structure from a rear surface, and the rear panel has an access hole, at a position corresponding to the access hole formed in the main structure, to access the latch key of the attaching/detaching mechanism from a rear surface.

According to the aspects of the present invention, an air pipe to supply air to the holding mechanism for the FOUP door and electric wires are arranged on the rear surface of the main structure.

According to the aspects of the present invention, a protruding portion for sealing is formed on the periphery of the surface of the main structure to form a space between the main structure and FOUP door when the port door holds the FOUP door.

With the FOUP opener according to the aspects of the present invention, a detachable surface panel is provided in the structure of the port door. Thus, the inside of the port door can be accessed from the front surface of the port door without removing the FOUP opener itself from the mini-environment.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate an embodiment of the invention and, together with the description, serve to explain the principles of the invention.

DETAILED DESCRIPTION OF THE PREFERRED EMBODIMENT

A preferred embodiment of the present invention will now be described in detail in accordance with the accompanying drawings.

<Overall Arrangement of FOUP Opener>

Figure 2:
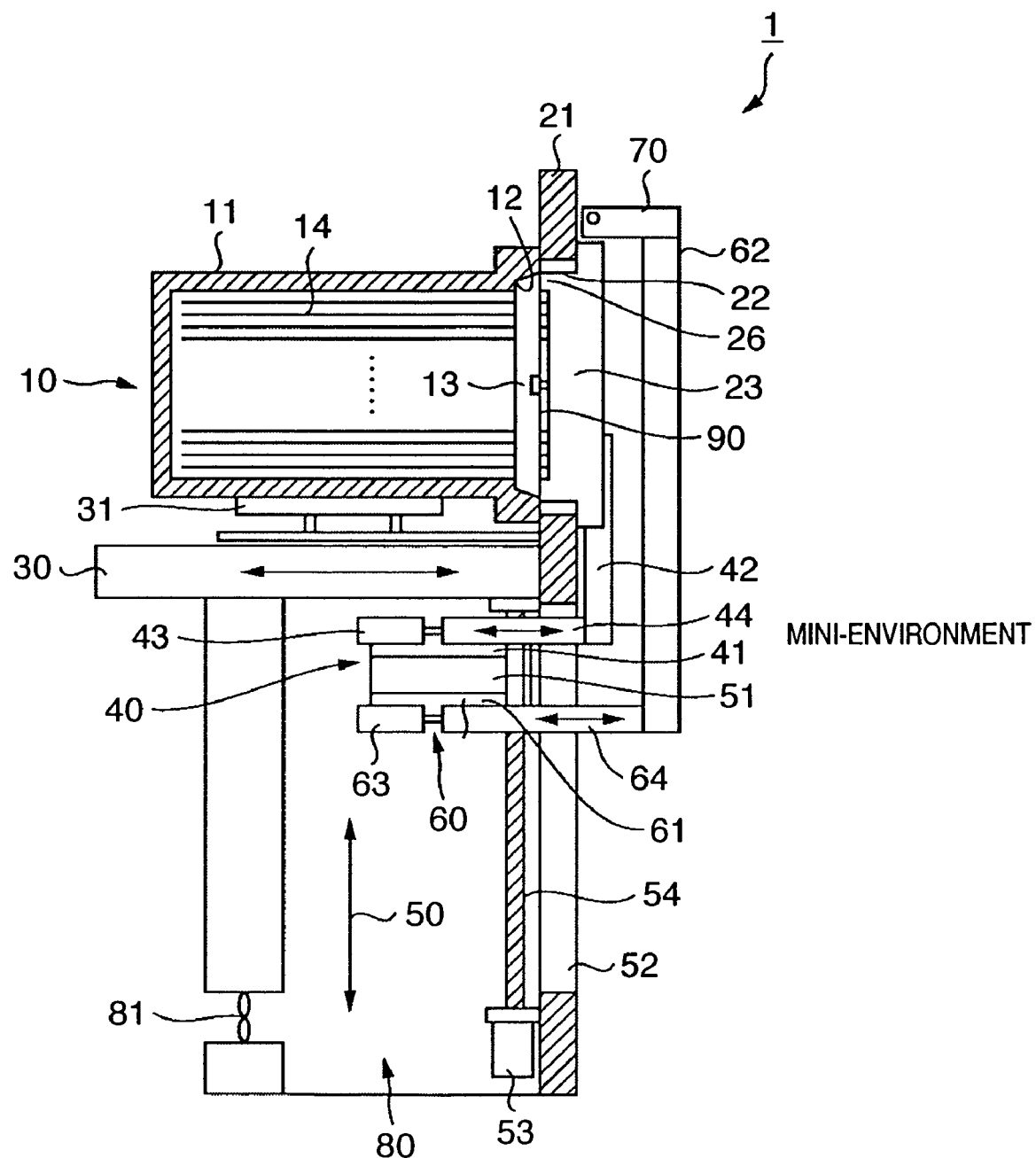
FIG. 2 is a view showing the appearance and arrangement of a FOUP opener according to an embodiment of the present invention to which a FOUP is attached.

FIG. 2 is a view showing the overall arrangement of a FOUP opener 1 according to an embodiment of the present invention. As shown in FIG. 2, the FOUP opener 1 according to this embodiment comprises a FOUP 10, dock plate 31, dock moving mechanism 30, port door 23, port plate 21, port door advancing/retreating mechanism 40, sensor advancing/retreating mechanism 60, and port door/sensor elevating mechanism 50. The FOUP 10 stores a plurality of semiconductor wafers 14 horizontally at predetermined pitches. The dock plate 31 places the FOUP 10 thereon to position it. The dock moving mechanism 30 moves the dock plate 31 to a position where a door (FOUP door) 13 of the FOUP 10 is detached. The port door 23 has an attaching/detaching mechanism and holding mechanism for attaching, detaching, and holding the FOUP door 13. The port plate 21 has an opening 22 which is closed with the port door 23. The port door advancing/retreating mechanism 40 moves the port door 23 horizontally. The sensor advancing/retreating mechanism 60 horizontally moves a sensor attaching member 62 in which a mapping sensor 70 is attached. The mapping sensor 70 detects the presence/absence of the semiconductor wafers 14, how the semiconductor wafers 14 are stored, the positions where the semiconductor wafers 14 are stored in the FOUP 10, and the like. The port door/sensor elevating mechanism 50 vertically moves the port door 23 and mapping sensor 70, while the port door 23 holds the FOUP door 13, to store the FOUP door 13 in the front end (a mini-environment).

When a front opening 12 of a FOUP frame 11 which forms the main body of the FOUP 10 is closed with the FOUP door 13, the FOUP 10 forms a sealed chamber. The port plate 21 and port door 23 form part of the FOUP supply-side wall body of the front end, and isolate the external atmosphere from the mini-environment which forms a clean room and serves as a wafer transfer space. Although not shown in detail, the sensor attaching member 62 is a rectangular frame and surrounds the port door 23 through a small gap.

In the port door advancing/retreating mechanism 40, an arm 44 extending at a right angle from the lower end of a downward extending portion 42 of the port door 23 is provided to the upper surface of an elevating base member 51 of the port door/sensor elevating mechanism 50 (to be described later) to be slidable along a linear guide 41. The distal end of the arm 44 is coupled to the output shaft of a motor 43 which drives the port door advancing/retreating mechanism 40. Thus, the arm 44 is driven by the motor 43 to advance or retreat horizontally (to the right or left in FIG. 1). The arm 44 is inserted in a thin, elongated-hole-like guide groove 52 formed under the opening 22 of the port plate 21, and moves horizontally and vertically in the guide groove 52.

In the sensor advancing/retreating mechanism 60, an arm 64 extending at a right angle from the lower end of the sensor attaching member 62 is provided to the lower surface of the elevating base member 51 of the port door/sensor elevating mechanism 50 (to be described later) to be slidable along a linear guide 61. The distal end of the arm 64 is coupled to a motor 63 which drives the sensor advancing/retreating mechanism 60. Thus, the arm 64 is driven by the motor 63 to advance or retreat horizontally. The arm 64 is inserted in the guide groove 52, in the same manner as the arm 44, is located below the arm 44, and moves horizontally and vertically in the guide groove 52.

Although not shown in detail, pairs of the right and left elevating base members 51, right and left arms 44, and right and left arms 64 are respectively provided near the right and left (behind and in front of the sheet of drawing of FIG. 2) edges of the port plate 21. The right and left elevating base members 51 are integrated as they are connected by a horizontally elongated plate-like connecting member (not shown). A nut accommodating portion which accommodates a ball nut threadably engaging with a screw shaft 54 is formed at the center in the horizontal direction of the connecting member. When the screw shaft 54 is rotated by a servo motor 53, the connecting member integrally having the nut accommodating portion which accommodates the ball nut threadably engaging with the screw shaft 54 moves vertically. Upon vertical movement of the connecting member, the port door 23 and sensor attaching member 62 integrally move vertically through the pairs of right and left elevating base members 51, right and left arms 44, and right and left arms 64.

The motor 43 for driving the port door advancing/retreating mechanism 40 is fixed to the upper surface of the right elevating base member 51, and the motor 63 for driving the sensor advancing/retreating mechanism 60 is fixed to the lower surface of the left elevating base member 51. As the motor 43 for driving the port door advancing/retreating mechanism 40 and the motor 63 for driving the sensor advancing/retreating mechanism 60 are distributed between the right and left sides in this manner, the right and left weights of one integral assembly comprising the connecting member, pair of right and left elevating base member 51, and two motors 43 and 63 balance. The two motors 43 and 63 can be fixed to the upper and lower surfaces of either the right or left elevating base member 51.

The servo motor 53, the screw shaft 54, the connecting member integrally having the nut accommodating portion, and the elevating base members 51 as a whole form the port door/sensor elevating mechanism 50. As shown in FIG. 2, the port door/sensor elevating mechanism 50 is arranged on the opposite side through the port plate 21 to the clean room (second control space) side where the port door 23 and sensor attaching member 62 are arranged, and is accommodated in a driving portion accommodating room 80 provided on this opposite side.

The motor 43 for driving the port door advancing/retreating mechanism 40 and the motor 63 for driving the sensor advancing/retreating mechanism 60 are fixed to the left and right elevating base members 51. Thus, the motors 43 and 63 are also accommodated in the driving portion accommodating room 80. That portion of the port door advancing/retreating mechanism 40 where the arm 44 slides along the linear guide 41 and that portion of the sensor advancing/retreating mechanism 60 where the arm 64 slides along the linear guide 61 are also accommodated in the driving portion accommodating room 80.

Hence, the driving portion (comprising the motor 43 for driving the port door advancing/retreating mechanism 40, and the linear guide 41) of the port door advancing/retreating mechanism 40, the driving portion (comprising the motor 63 for driving the sensor advancing/retreating mechanism 60, and the linear guide 61) of the sensor advancing/retreating mechanism 60, and the driving portion (comprising the servo motor 53, the screw shaft 54, the connecting member integrally having the nut accommodating portion, and the pair of right and left elevating base members 51) of the port door/sensor elevating mechanism 50 are arranged on the opposite side through the port plate 21 to the mini-environment (clean room) side where the port door 23 and sensor attaching member 62 are arranged, are isolated from the mini-environment (clean room), and are accommodated in the driving portion accommodating room 80 which is arranged on this opposite side.

A fan 81 is provided to the driving portion accommodating room 80 to externally discharge the atmosphere in it. Dust generated by the driving portion of the port door advancing/retreating mechanism 40, the driving portion of the sensor advancing/retreating mechanism 60, and the driving portion of the port door/sensor elevating mechanism 50 is discharged to an external atmosphere by the fan 81 and does not pollute the mini-environment (clean room). The fan 81 is preferably set at a possible lowest portion on the room wall of the driving portion accommodating room 80.

<Attaching/Detaching Operation of FOUP Door>

Figure 3:
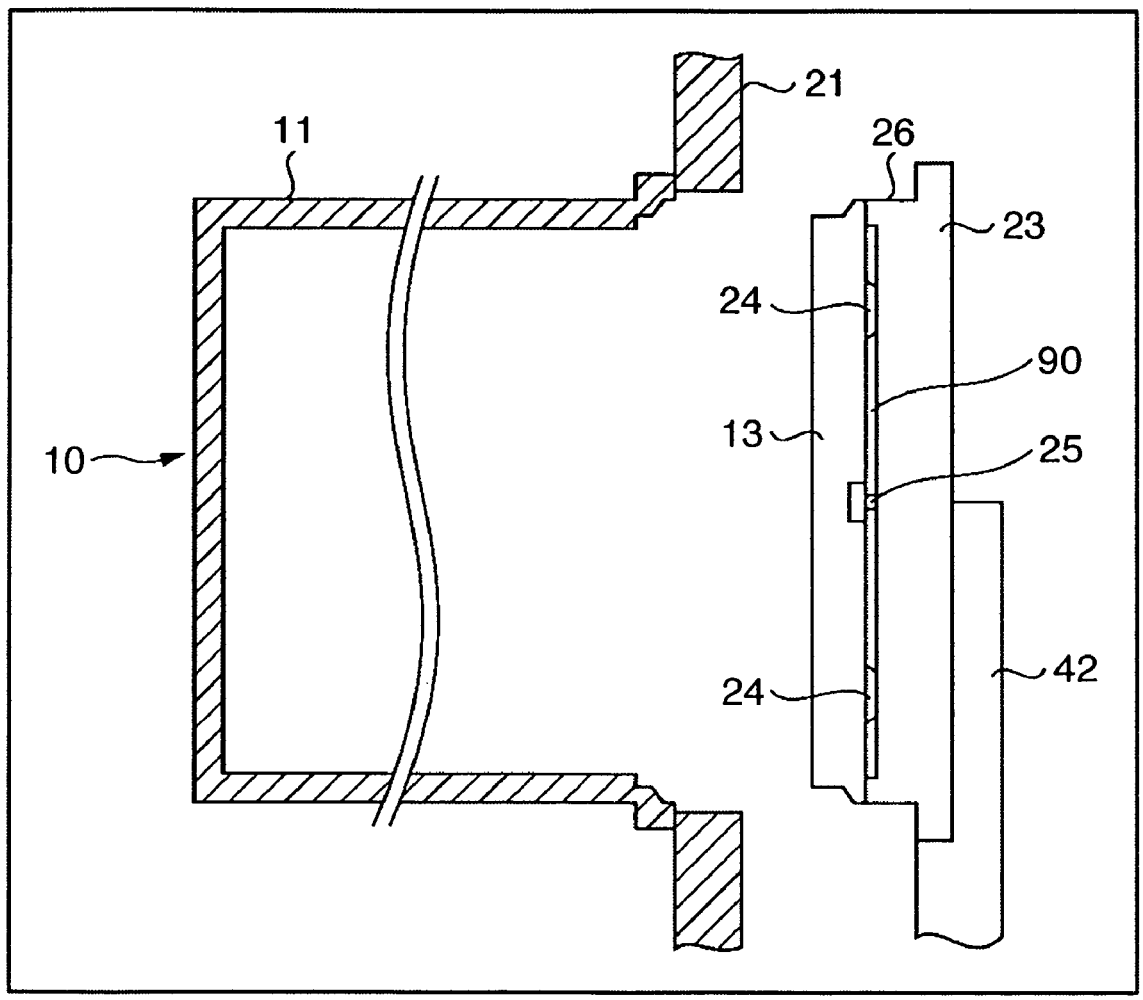
FIG. 3 is a schematic partial longitudinal sectional view showing a state immediately after the FOUP door of the FOUP opener is opened.
Figure 4:
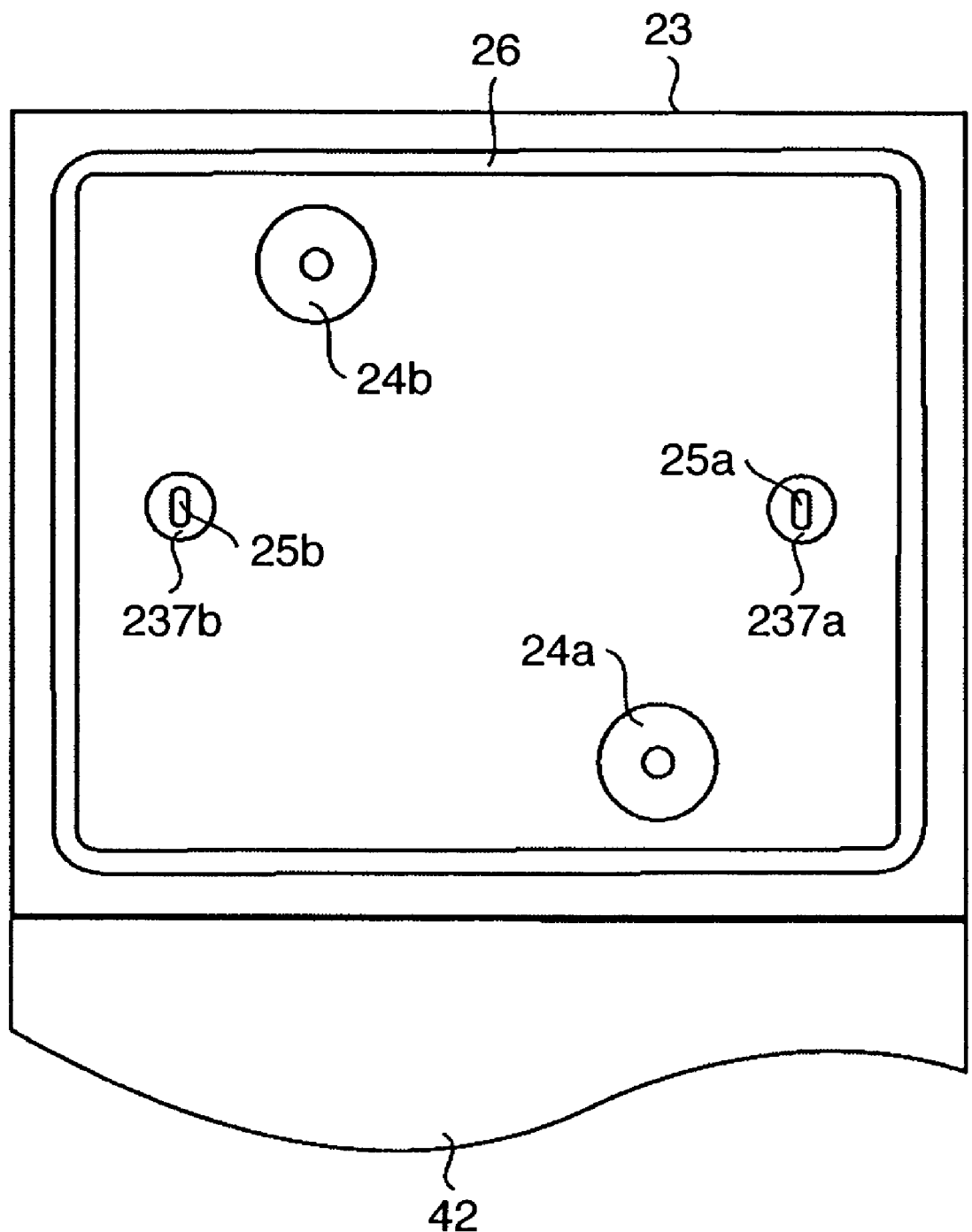
FIG. 4 is a view showing the front surface of a port door which constitutes the FOUP opener.

As shown in FIGS. 3 and 4, the attaching/detaching mechanism for the FOUP door 13 provided to the port door 23 has two, right and left latch keys 25 on the front surface (see FIG. 4) of the port door 23. The latch keys 25 engage or disengage latch mechanisms with or from which the FOUP door 13 is detachably mounted on the front opening 12 of the FOUP frame 11. The holding mechanism for the FOUP door 13 provided to the port door 23 has two, upper left and lower right vacuum pads 24, which communicate with a vacuum source, on the front surface (see FIG. 4) of the port door 23. Key grooves (not shown) in which the latch keys 25 are to be inserted are formed in the FOUP door 13. The key grooves form the operation ends of the latch mechanisms.

The holding mechanism for the FOUP door 13 provided to the port door 23 will be described. In the FOUP door holding mechanism provided to the port door 23, the vacuum pads 24 communicating with the vacuum source hold the outer wall surface of the FOUP door 13, so the port door 23 can hold the FOUP door 13. Assume that the FOUP 10 is to be opened so the wafers 14 stored in the FOUP 10 can be extracted and subjected to various types of processes. When the latch mechanisms with which the FOUP door 13 is detachably mounted on the opening 12 of the FOUP frame 11 are disengaged, the FOUP door 13 disengages from the FOUP frame 11. Then, the FOUP door holding mechanism is actuated to hold the FOUP door 13 with the port door 23.

When the FOUP door 13 is held by the port door 23 in this manner, a space 90 formed between the outer wall surface of the FOUP door 13 and the FOUP system-side outer surface of the port door 23 is sealed by a sealing means 26 provided to the port door 23 throughout substantially the entire spread of the outer wall surface of the FOUP door 13.

<Structure of Port Door 23>

Figure 5:
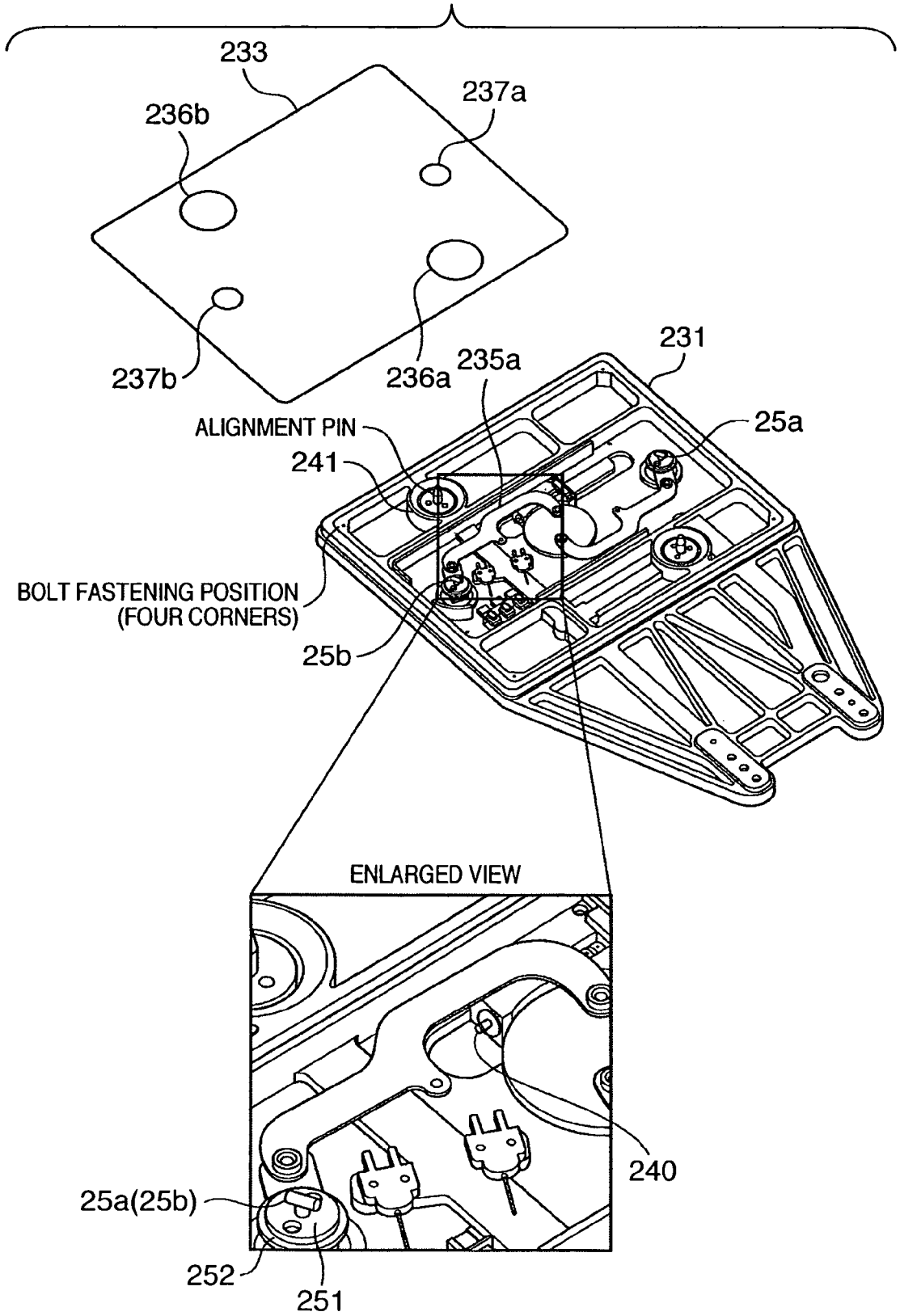
FIG. 5 is a view showing the exploded structure of the port door according to the embodiment shown in FIG. 2.
Figure 6:
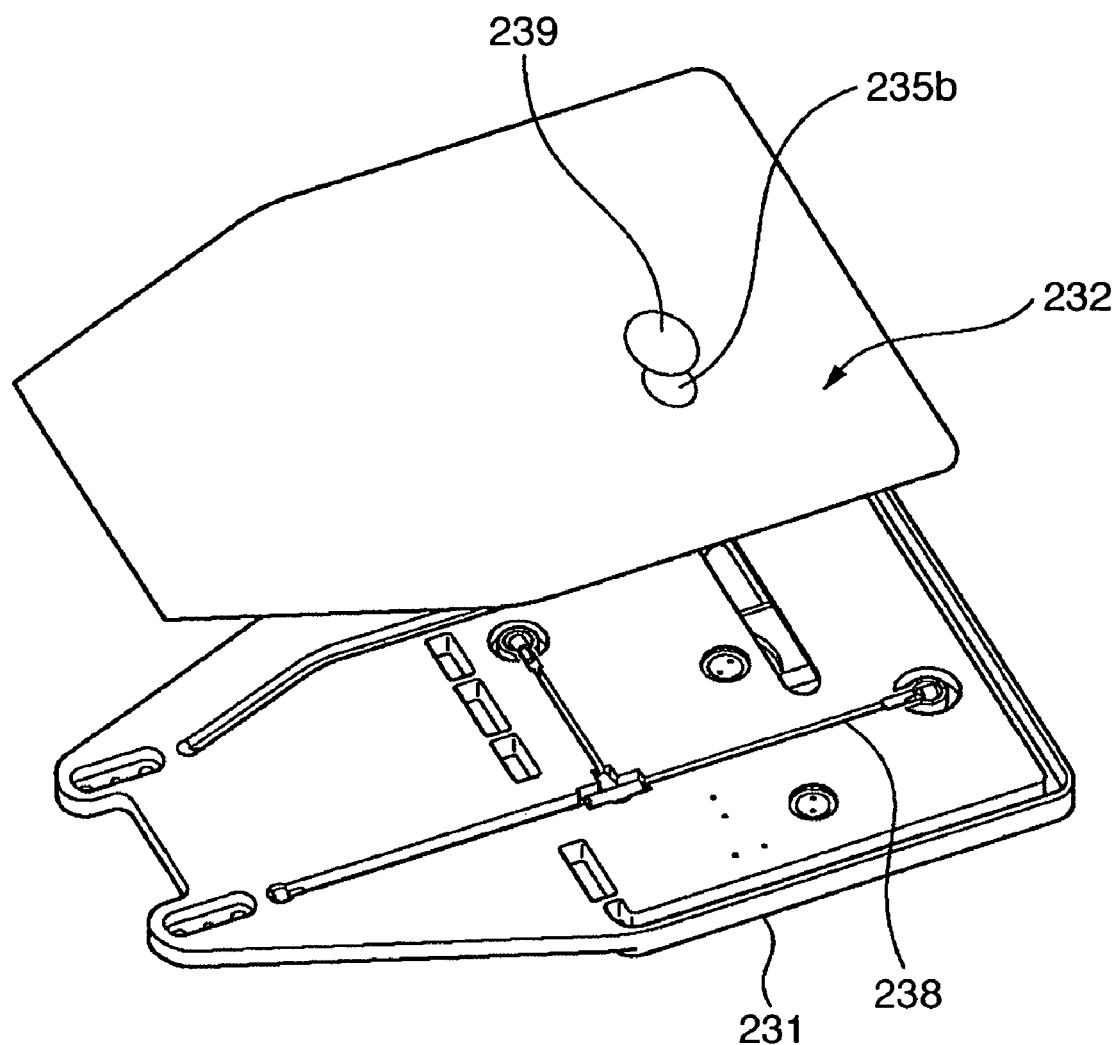
FIG. 6 is a view showing the arrangement of the main structure of the port door according to the embodiment shown in FIG. 2.

FIGS. 5 and 6 show the port door 23 in an exploded state. As shown in FIG. 5, the port door 23 mainly comprises a main structure 231, rear panel 232, and surface panel 233 that are adhered together. FIG. 6 shows the relationship between the rear surface of the main structure 231 and the rear panel 232.

An explanation will be made with reference to FIG. 5. The main structure 231 has an access hole 235a. As shown in FIG. 6, the rear panel 232 also has an access hole (opening) 235b. The access hole 235b is an opening smaller than the access hole 235a. The access holes 235a and 235b are located at the same position when the main structure 231 and rear panel 232 are adhered together. When the main structure 231 and rear panel 232 are adhered together, the two access holes 235a and 235b communicate with each other, and a latch key disengaging mechanism can be accessed from the access hole 235b with a predetermined tool.

For example, assume that the port door 23 stops due to some troubles while holding the FOUP door 13. In this case, the FOUP door 13 must be forcedly released. The access holes 235a and 235b respectively formed in the main structure 231 and rear panel 232 serve for this situation. The access hole 235a formed in the main structure 231 communicates with a nut attached to a worm gear 240 which operates the latch keys. If the port door 23 stops while holding the FOUP door 13, the operator turns off the power supply of the apparatus temporarily, and rotates the nut forcedly with a predetermined tool through the access holes 235a and 235b from the rear side of the apparatus, i.e., from the mini-environment side. While the port door 23 holds the FOUP door 13, the latch keys engage with each other. Thus, the operator rotates the nut to disengage the latch keys forcedly, so as to release the FOUP door 13. After that, the surface panel 233 is removed from the front surface of the apparatus to cope with the trouble. The access hole 235b formed in the rear panel 232 is usually provided with a seal 239 which covers the access hole 235b. When trouble occurs, the seal 239 is removed to cope with the trouble. This prevents dust from entering the mini-environment.

The main structure 231 has vacuum pads 24a and 24b. The vacuum pads 24a and 24b operate when air is taken in from them by an air pipe arranged in an air groove 238 formed in the rear surface (the surface covered with the rear panel 232) of the main structure 231. Vacuum pad holes 236a and 236b extending through the vacuum pads 24a and 24b have protruded peripheral portions to exhibit a seal effect. In this manner, the main structure 231 has steps that protrude at the peripheral portions located at the respective holes of the surface panel 233. Thus, no seal member is necessary, and the number of components does not increase.

The surface panel 233 attached to the main structure 231 covers latch mechanisms 234 and the like accommodated in the main structure 231. The surface panel 233 has the vacuum pad holes 236a and 236b to expose the vacuum pads 24a and 24b from the surface panel 233, and latch key holes 237a and 237b to expose latch keys 25a and 25b from the surface panel 233.

Figure 1:
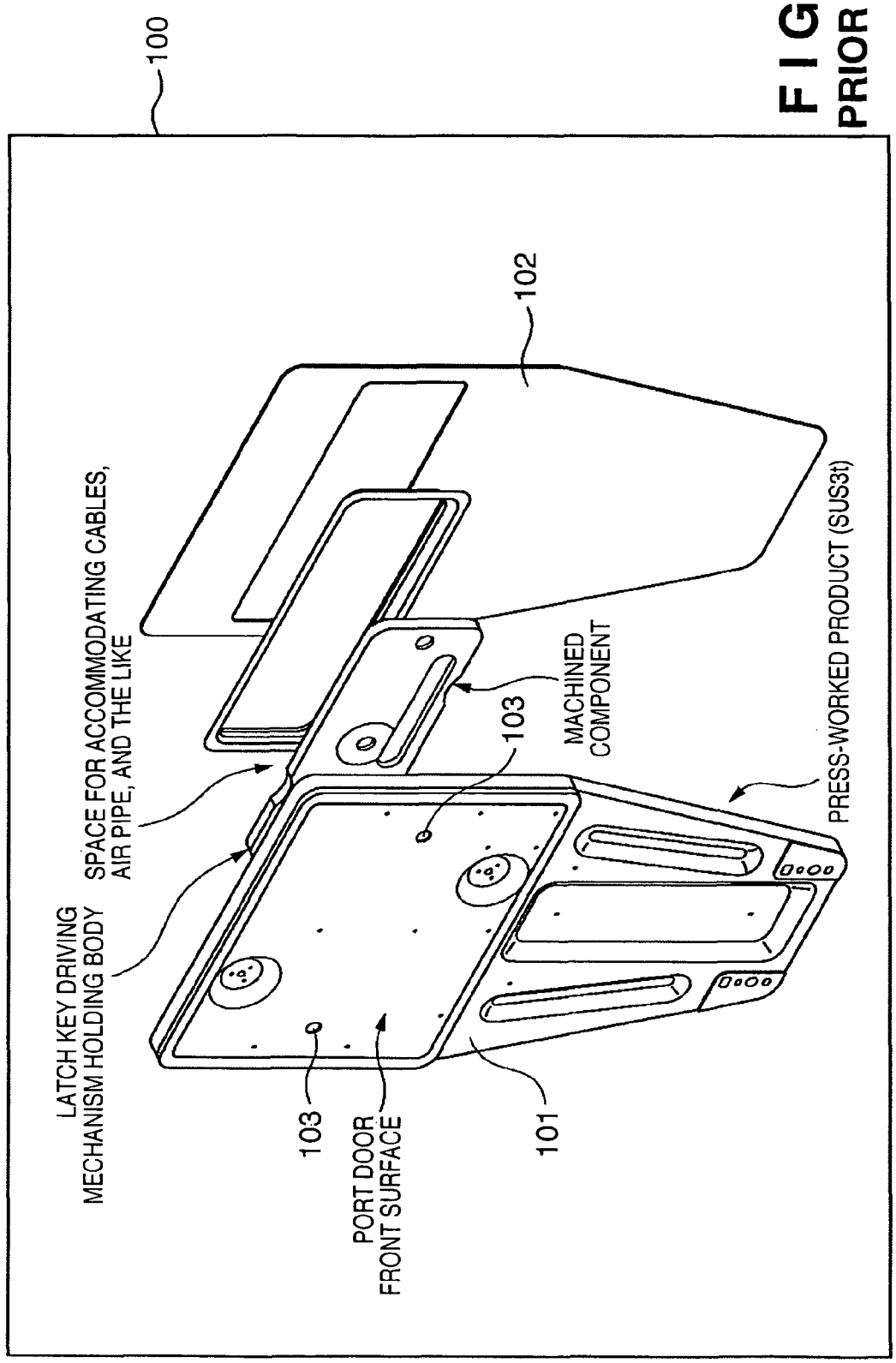
FIG. 1 is a view showing the exploded structure of a conventional port door.

Latch key holes are formed in the conventional port door shown in FIG. 1 as well (see 103 of FIG. 1). Each of the latch key holes 237a and 237b of the port door 23 according to this embodiment has a larger diameter than that of the conventional latch key hole. More specifically, the conventional latch key holes 103 are formed as small as possible so dust will not enter the mini-environment through them. Even when the operator tries to remove the port door front member 101, it cannot be removed as the latch keys and the port door front member 101 interfere with each other (the latch keys are caught by the latch key holes 103) (see FIG. 1). The same problem arises with the vacuum pads 24a and 24b and suction holes. Regarding this, according to this embodiment, the latch key holes 237a and 237b do not interfere with the latch keys 25*a* and 25*b*, and the vacuum pads 24*a* and 24*b* have sufficiently large diameters so they will not interfere with the vacuum pad holes 236*a* and 236*b*. Therefore, the surface panel 233 can be removed from the main structure 231 easily. When no FOUP is placed, trouble can be coped with, and maintenance such as cleaning and component exchange can be performed easily without removing the FOUP opener 1 from the mini-environment but by only removing the surface panel 233. Therefore, although the port door front surface (main structure 231) is exposed to the outer air, dust hardly enters the mini-environment.

Assume that the port door 23 stops while holding the FOUP door 13 due to trouble or the like (although this happens rarely). In this case, the latch keys 25*a* and 25*b* are forcedly disengaged from the access hole 235*b* in the rear side of the port door 23 without removing the FOUP opener 1 from the mini-environment, to release the FOUP door 13. In this case, the operator enters the mini-environment temporarily and disengages the FOUP door 13 with the above procedure. As the operator need only release the FOUP door 13, it does not take much time to recover the cleanliness again. Also, cumbersome position adjustment operation for setting the FOUP opener 1 again is not required.

As described above, when a comparatively large opening is formed in the surface panel 233, dust may enter through it. To prevent this, according to this embodiment, as shown in FIG. 5, lid members (spacers) 251 are provided to the distal ends of the latch keys 25*a* and 25*b* to shield the latch key holes 237*a* and 237*b* and to prevent dust from entering through the latch key holes 237*a* and 237*b*. The lid members 251 respectively have flanges 252.

Figure 8:
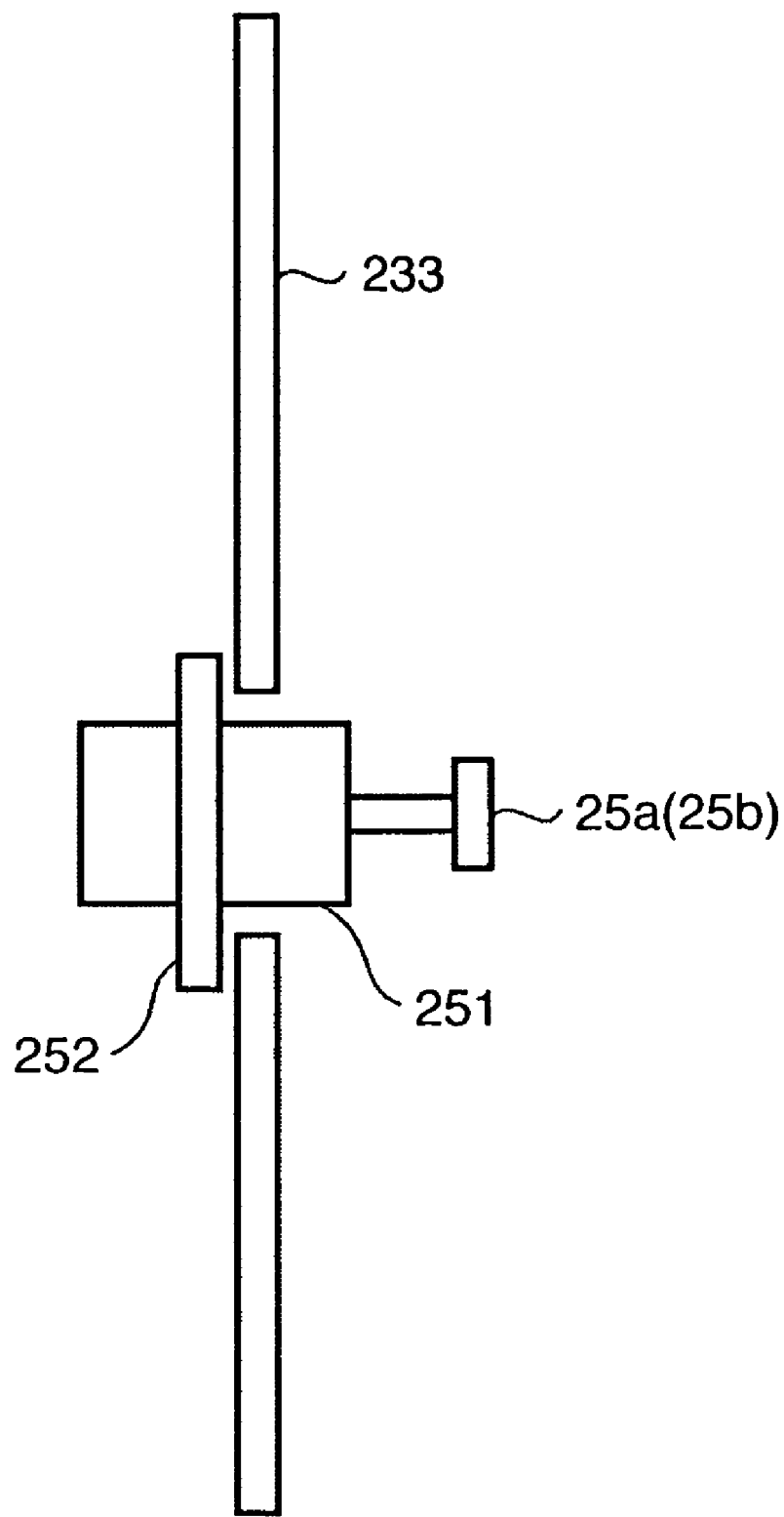
FIG. 8 is a sectional view showing the relationship between a surface panel and latch key.

FIG. 8 is a sectional view for explaining the relationship between the latch key holes 237*a* and 237*b* of the surface panel 233 and the latch keys. As shown in FIG. 8, the latch key 25*a* (25*b*) can pass through the latch key hole 237*a* (237*b*) with no interference. When the surface panel 233 is attached to the main structure 231, the flange 252 of the lid member 251 tightly seals the latch key hole 237*a* (237*b*). Therefore, even if a hole larger than the conventional hole is formed in the surface panel 233, dust or the like enters through the hole at a very low possibility.

The main structure 231 has, as a structure for a portion that accommodates the vacuum pads to hold the FOUP door 13, a frame structure 241 which shields the vacuum pad holes 236*a* and 236*b* and prevents dust from entering through the vacuum pad holes 236*a* and 236*b*. With this structure, even if an opening larger than the conventional opening is formed in the surface panel 233, influences caused by the dust can be substantially eliminated.

The surface panel 233 has substantially the same size as that of the perimeter of the FOUP door 13, and is fastened to the main structure 231 at its four corners using flat-head bolts. As the flat-head bolts are used for fastening, the bolt heads do not project from the surface panel 233 after fastening. When the port door 23 holds the FOUP door 13, the bolt heads do not collide against the FOUP door 13. Therefore, dust is hardly generated by the collision, and the danger of causing trouble by the dust can be minimized.

Figure 7:
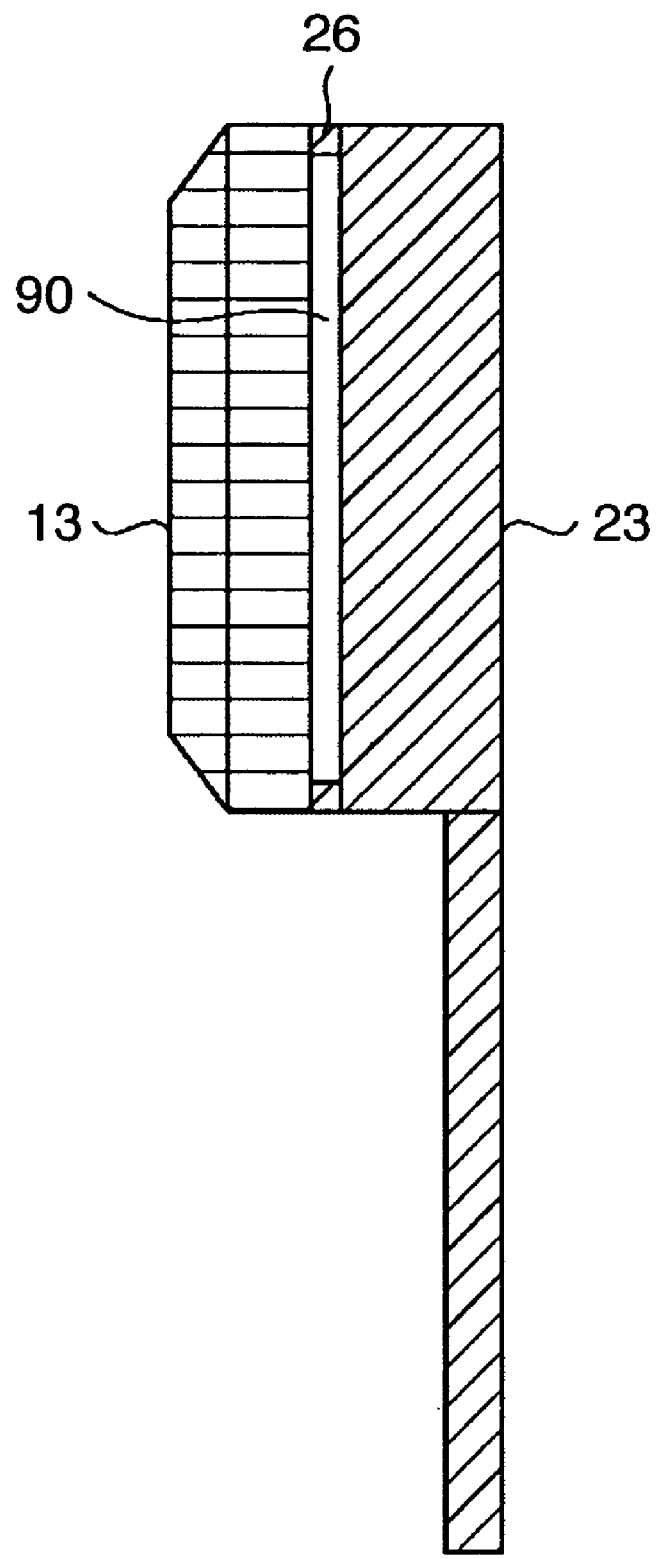
FIG. 7 is a view showing a state wherein the port door holds the FOUP door.

The main structure 231 has a structure (sealing means 26) in which the outer edge of the main structure 231 which surrounds the surface panel 233 protrudes slightly higher than the surface panel 233 (see FIG. 7). Because of the presence of the sealing means 26, when the port door 23 mates with the FOUP door 13 to hold it, the gap 90 is formed between the surface panel 233 and FOUP door 13. While the port door 23 holds the FOUP door 13, the entire surfaces of the doors 23 and 13 do not adhere to each other tightly, and the collision surface at the start of holding can be minimized. Dust generated by the collision can be minimized. Even if the collision generates dust, since the space 90 is sealed, the dust will not enter the mini-environment to prevent pollution of the clean environment in the mini-environment.

The air groove 238 where the air pipe is to be arranged is formed in the rear surface of the main structure 231. The rear panel 232 serves as a seal member to prevent air leakage from the air pipe, and covers the air groove 238. Wirings and the like (not shown) are accommodated in the space between the main structure 231 and rear panel 232.

The structures of the port door 23 having the above structure are more complicated than those fabricated by conventional press working. When, however, these structures are fabricated by, e.g., die casting, a complicated structure can be coped with easily and comparatively at a low cost. Therefore, even a structure that covers a large opening formed in the surface panel 233 from the rear side can be formed easily.

<Effect of Embodiment>

The FOUP opener 1 according to the embodiment having the above arrangement uses the detachable surface panel 233 as one structure of the port door 23. In addition to maintenance such as replenishing grease for the latch keys 25 and the like and exchanging a component such as a vacuum mechanism to hold the FOUP door 13, if trouble occurs, they can be coped with by only removing the surface panel 233 without extracting the FOUP opener 1 itself from the mini-environment. Most of troubles occur at some portions on the surface of the main structure 231, components supported at such portions, or the like. It is therefore effective to make the surface panel 233 detachable, leading to a great decrease in cumbersome work of the operator.

Even when the port door 23 stops due to trouble or the like while holding the FOUP frame 11, since the access hole 235*b* from the rear side is formed in the port door 23, the operator can access the inside of the port door 23 from the rear side to release the FOUP door 13 easily. Only a very short period of time is required for releasing, so the FOUP opener 1 need not be removed, and the operator must stay in the mini-environment only for a very short period of time. Therefore, troubles can be coped with appropriately while minimizing environmental pollution in the mini-environment.

Even when the port door 23 stops due to trouble or the like while holding the FOUP frame 11, since the access hole from the rear side is formed in the port door 23, the operator can access the inside of the port door 23 from the rear side to release the FOUP door 13 easily. Only a very short period of time is required for releasing, so the FOUP opener 1 need not be removed, and the operator must stay in the mini-environment 200 only for a very short period of time. Therefore, troubles can be coped with appropriately while minimizing environmental pollution in the mini-environment 200.

As many apparently widely different embodiments of the present invention can be made without departing from the spirit and scope thereof, it is to be understood that the invention is not limited to the specific embodiments thereof except as defined in the appended claims.

This application claims the benefit of Japanese Patent Application No. 2005-051323 filed on Feb. 25, 2005, which is hereby incorporated by reference herein its entirety.

What is claimed is:

1. A FOUP opener in which a FOUP is placed and a FOUP door of the FOUP can be detached so as to allow access to an interior of the FOUP, said FOUP opener comprising:

a port door having an attaching/detaching mechanism for attaching and detaching the FOUP door and a holding mechanism for holding the FOUP door to be detached; and port door moving means for moving said port door holding the FOUP door so that the FOUP is opened, wherein said port door includes:

a main structure in which said attaching/detaching mechanism is arranged on a first surface of said main structure and said holding mechanism is arranged on a second surface of said main structure;

a first surface panel covering the first surface of said main structure; and a second surface panel covering the second surface of said main structure, and wherein said first and second surface panels are detachable from said main structure to allow access to an interior of the main structure of the port door and re-attachable after said panels have been detached.

2. The FOUP opener according to claim 1, wherein the first surface is a front surface of said main structure, the second surface is on a rear surface of said main structure, and said port door further includes:

a first opening in said first surface panel for exposing a portion of said attaching/detaching mechanism on a front side of said port door;

a second opening in said main structure to which a portion of said holding mechanism is inserted; and a third opening in said first surface panel for exposing the portion of said holding mechanism on the front side of said port door.

3. The FOUP opener according to claim 2 wherein said port door includes:

an access opening in said main structure, through which said attaching/detaching mechanism can be handled from a rear side of said main structure.

4. The FOUP opener according to claim 2, wherein the portion of said attaching/detaching mechanism comprises a latch key for operating a latch mechanism which is provided with the FOUP and attaches and detaches the FOUP door, the portion of said holding mechanism comprises a vacuum pad, and said first opening is a latch key hole through which said latch key is inserted and which has such a size as not to interfere with said latch key.

5. A FOUP opener in which a FOUP is placed and a FOUP door of the FOUP can be detached so as to allow access to an interior of the FOUP, said FOUP opener comprising:

a port door having an attaching/detaching mechanism for attaching and detaching the FOUP door and a holding mechanism for holding the FOUP door to be detached; and port door moving means for moving said port door holding the FOUP door so that the FOUP is opened, wherein said port door includes:

a main structure in which said attaching/detaching mechanism is arranged on a front surface of said main structure and said holding mechanism is arranged on a rear surface of said main structure;

a front surface panel covering the front surface of said main structure;

a rear surface panel covering the rear surface of said main structure;

a first opening in said front surface panel for exposing a portion of said attaching/detaching mechanism on a front side of said port door;

a second opening in said main structure to which a portion of said holding mechanism is inserted;

a third opening in said front surface panel for exposing the portion of said holding mechanism on the front side of said port door;

an access opening in said main structure, through which said attaching/detaching mechanism can be handled from the rear side of said main structure; and wherein said front surface panel is detachable from said main structure to allow access to an interior of the main structure of the port door and re-attachable after said front surface panel has been detached, and said rear surface panel has an opening at a position to communicate with said access opening.

6. The FOUP opener according to claim 5, wherein the opening in said rear surface panel is closed with a removable seal member.

7. The FOUP opener according to claim 4, wherein said third opening is a vacuum pad hole through which said vacuum pad is inserted and which has such a size as not to interfere with said vacuum pad.

8. The FOUP opener according to claim 4, wherein said latch key comprises a lid member to shield the latch key hole.

9. The FOUP opener according to claim 1, wherein said main structure includes a first recess in the first surface and a second recess in the second surface, said attaching/detaching mechanism is arranged in said first recess, and said holding mechanism is arranged in said second recess.

10. The FOUP opener according to claim 5, wherein said main structure includes a first recess in the front surface and a second recess in the rear surface, said attaching/detaching mechanism is arranged in said first recess, and said holding mechanism is arranged in said second recess.

11. The FOUP opener according to claim 2, wherein said holding mechanism includes a vacuum pad and an air pipe connected to said vacuum pad, the portion of said holding mechanism inserted in said second opening comprises said vacuum pad, said main structure includes a first recess in the front surface and a second recess in the rear surface, said attaching/detaching mechanism is arranged in said first recess, and said air pipe is arranged in said second recess.

12. The FOUP opener according to claim 10, wherein said holding mechanism includes a vacuum pad and an air pipe connected to said vacuum pad, the portion of said holding mechanism inserted in said second opening comprises said vacuum pad, and said air pipe is arranged in said second recess.

13. The FOUP opener according to claim 11, wherein said main structure includes a protruded peripheral portion provided in said first recess and defining said second opening.

14. The FOUP opener according to claim 12, wherein said main structure includes a protruded peripheral portion provided in said first recess and defining said second opening.

* * * * *